United States Patent
Hasegawa et al.

(10) Patent No.: US 10,483,087 B2
(45) Date of Patent: Nov. 19, 2019

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventors: Kei Hasegawa, Yokohama (JP); Hayato Kimura, Suntou-gun (JP); Ryoh Kawana, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/637,527

(22) Filed: Jun. 29, 2017

(65) Prior Publication Data
US 2018/0005799 A1 Jan. 4, 2018

(30) Foreign Application Priority Data
Jul. 4, 2016 (JP) .................................. 2016-132690

(51) Int. Cl.
*H01J 37/05* (2006.01)
*H01J 37/317* (2006.01)
(Continued)

(52) U.S. Cl.
CPC ........ *H01J 37/3177* (2013.01); *H01J 37/045* (2013.01); *H01J 37/09* (2013.01);
(Continued)

(58) Field of Classification Search
CPC . H01J 37/3174; H01J 37/3175; H01J 37/3177
(Continued)

(56) References Cited

U.S. PATENT DOCUMENTS

| | | | | |
|---|---|---|---|---|
| 2012/0286170 | A1* | 11/2012 | Van De Peut | ......... B82Y 10/00 |
| | | | | 250/397 |
| 2015/0090896 | A1* | 4/2015 | Tsuchiya | ............... H01J 37/045 |
| | | | | 250/397 |

FOREIGN PATENT DOCUMENTS

| | | |
|---|---|---|
| JP | 2013-93567 | 5/2013 |
| JP | 2014-7327 | 1/2014 |

(Continued)

OTHER PUBLICATIONS

Korean Office Action dated Jun. 19, 2018 in Korean Patent application No. 10-2017-0084210, 9 pages.

*Primary Examiner* — Jason L McCormack
(74) *Attorney, Agent, or Firm* — Oblon, McClelland, Maier & Neustadt, L.L.P.

(57) ABSTRACT

In one embodiment, a multi charged particle beam writing apparatus includes a blanking plate including a plurality of blankers, bitmap generation processing circuitry generating bitmap data for each writing pass of multi-pass writing, the bitmap data specifying irradiation time periods for a plurality of irradiation positions, a plurality of dose correction units configured to receive bitmap subdata items obtained by dividing the bitmap data from the bitmap generation processing circuitry, and correct the irradiation time periods to generate a plurality of dose data items corresponding to respective processing ranges, and data transfer processing circuitry transferring the plurality of dose data items to the blanking plate through a plurality of signal line groups. Each of the signal line groups corresponds to the blankers located in a predetermined region of the blanking plate. The data transfer processing circuitry changes the signal line groups, used to transfer the plurality of dose data items generated by the respective dose correction units, for each writing pass.

2 Claims, 11 Drawing Sheets

(51) Int. Cl.
    *H01J 37/20*     (2006.01)
    *H01J 37/09*     (2006.01)
    *H01J 37/04*     (2006.01)
    *H01J 37/302*     (2006.01)

(52) U.S. Cl.
    CPC .......... *H01J 37/20* (2013.01); *H01J 37/3023* (2013.01); *H01J 2237/0453* (2013.01); *H01J 2237/202* (2013.01); *H01J 2237/30455* (2013.01); *H01J 2237/31774* (2013.01)

(58) Field of Classification Search
    USPC .................. 250/492.1, 492.2, 492.3, 453.11
    See application file for complete search history.

(56) References Cited

FOREIGN PATENT DOCUMENTS

| | | |
|---|---|---|
| JP | 2015-2189 | 1/2015 |
| JP | 2015-29096 | 2/2015 |
| JP | 2015-201576 | 11/2015 |
| JP | 2016-15528 | 1/2016 |
| KR | 10-2012-0036876 A | 4/2012 |

* cited by examiner

1st PASS

2nd PASS

3rd PASS

4th PASS

1st PASS

2nd PASS

3rd PASS

4th PASS

1st PASS

2nd PASS

3rd PASS

4th PASS

1st PASS

2nd PASS

3rd PASS

4th PASS

5th PASS

6th PASS

7th PASS

8th PASS

1st PASS

2nd PASS

3rd PASS

4th PASS

FIG. 11E 5th PASS
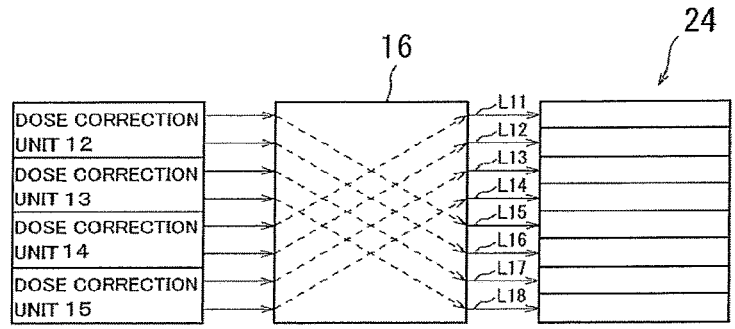
FIG. 11F 6th PASS
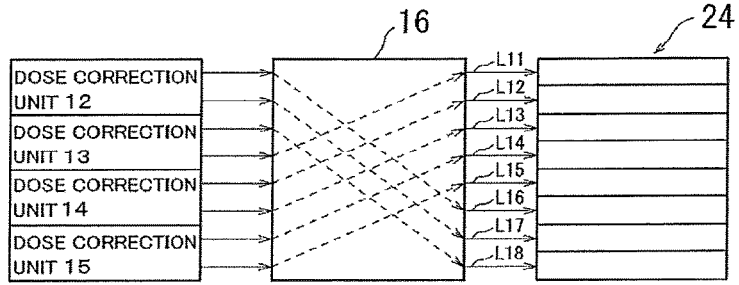
FIG. 11G 7th PASS
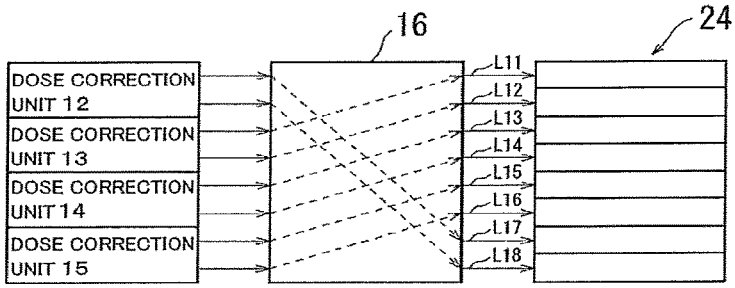
FIG. 11H 8th PASS
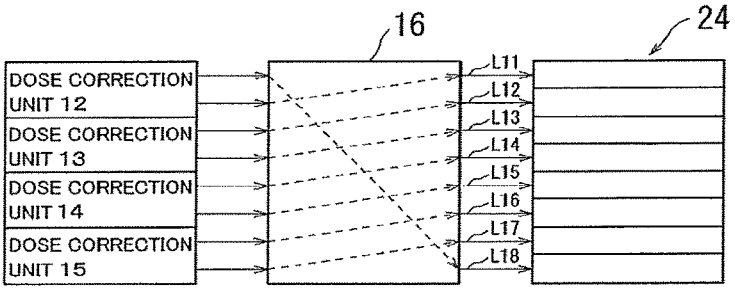

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2016-132690, filed on Jul. 4, 2016, the entire contents of which are incorporated herein by reference.

FIELD

The present invention relates to a multi charged particle beam writing apparatus and a multi charged particle beam writing method.

BACKGROUND

Along with an improvement in integration of LSIs, circuit line widths of semiconductor devices have become finer. As an example of a method for forming exposure masks (exposure masks used in steppers and scanners are also called reticles) that are used for forming circuit patterns in such semiconductor devices, an electron-beam writing technology having high resolution has been used.

For example, there are writing apparatuses that use multiple beams. The use of multiple beams can greatly improve the throughput because it enables irradiation with more beams at a time (in a single shot) than in the case where writing is performed using a single electron beam. In such multi-beam writing apparatuses, for example, multiple beams are formed by letting an electron beam emitted from an electron gun pass through an aperture member having a plurality of apertures. Blanking control is performed on each of the beams. Unblocked beams are each reduced by an optical system, and a substrate placed on a movable stage is irradiated with the resulting beams.

Multi-beam writing uses many beams, resulting in an enormous amount of data for individually controlling irradiation time periods of the beams. To solve such a problem, a considered approach involves causing a plurality of computers to perform parallel processing such that the amount of data processed by each computer is reduced.

One of known multi-beam writing techniques is multi-pass writing that involves dividing a necessary dose into multiple writing (exposure) steps in order to average variations in beam current or reduce the effect of resist heating. In multi-pass writing, for example, writing is repeated while irradiation positions are shifted on a stripe-by-stripe basis.

In multi-pass writing while shifting the irradiation positions, computers configured to perform parallel processing process different data items for each pass of the multi-pass writing. Each computer therefore has to include a large-capacity memory to hold data to be processed. Furthermore, the amount of data transmitted and received by each computer is large. Disadvantageously, it takes a long time to transfer data.

BRIEF DESCRIPTION OF THE DRAWINGS

FIGS. 11E to 11H are diagrams explaining the data transfer processing by the data transfer unit.

DETAILED DESCRIPTION

In one embodiment, a multi charged particle beam writing apparatus includes a movable stage on which a substrate, serving as a writing target, is placed, an emitter emitting a charged particle beam;

an aperture plate including a plurality of openings through which the charged particle beam passes to form multiple beams, a blanking plate including a plurality of blankers each performing blanking deflection on a corresponding one of the multiple beams, bitmap generation processing circuitry generating bitmap data for each writing pass of multi-pass writing, the bitmap data specifying irradiation time periods for a plurality of irradiation positions allocated to meshes obtained by virtually dividing a writing area of the substrate, a plurality of dose correction units configured to receive bitmap subdata items obtained by dividing the bitmap data from the bitmap generation processing circuitry, correct the irradiation time periods to generate a plurality of dose data items corresponding to respective processing ranges, and hold the plurality of dose data items, and data transfer processing circuitry transferring the plurality of dose data items generated or held by the plurality of dose correction units to the blanking plate through a plurality of signal line groups. Each of the signal line groups is used to transmit the dose data item for controlling the blankers located in a corresponding region of the blanking plate. The data transfer processing circuitry changes the signal line groups, used to transfer the plurality of dose data items generated or held by the respective dose correction units, for each writing pass.

In an embodiment, a configuration that uses an electron beam as an example of a charged-particle beam will be described below. Note that a charged-particle beam is not limited to an electron beam and may be another charged-particle beam, such as an ion beam.

Figure 1:
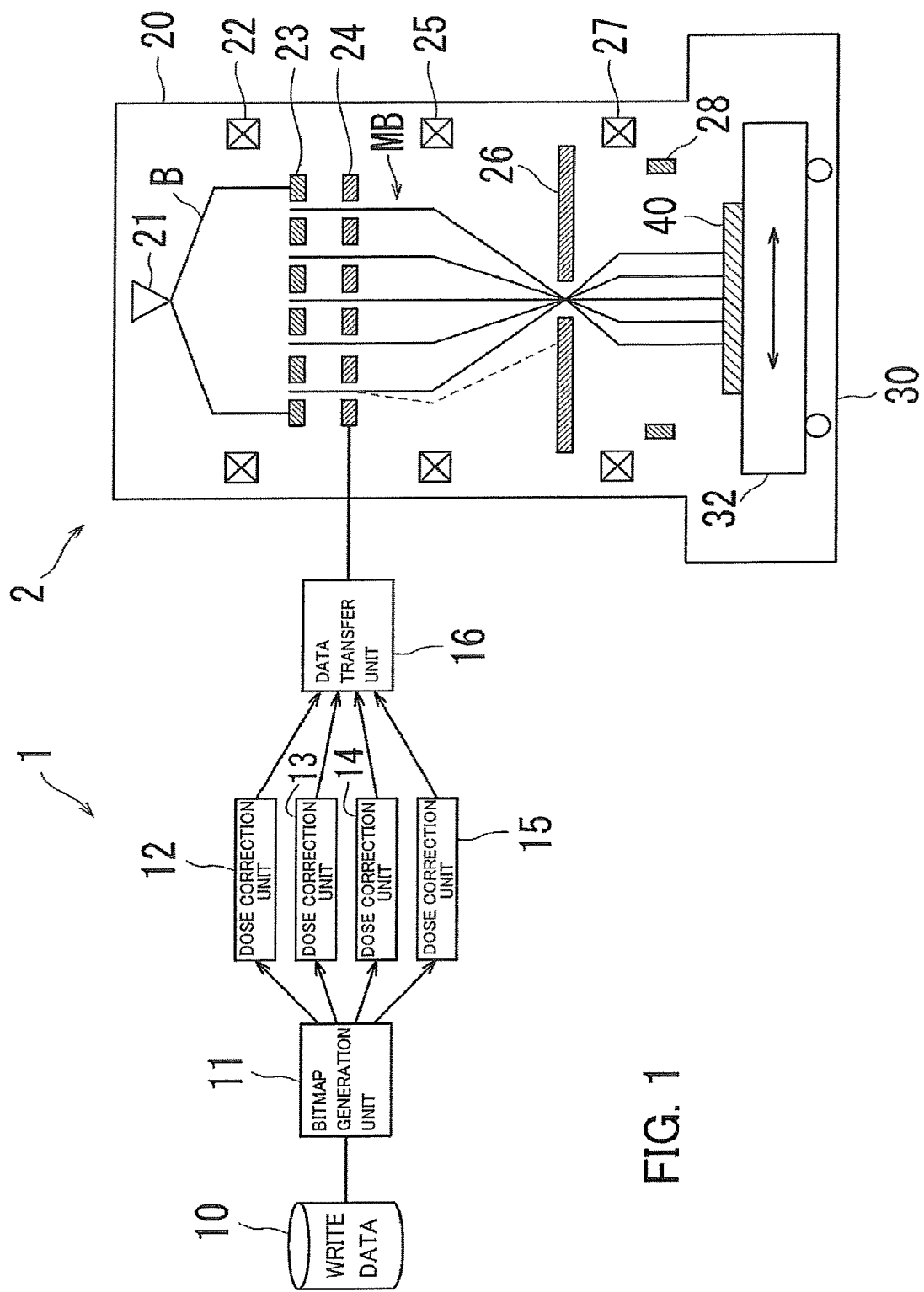
FIG. 1 is a schematic diagram of a writing apparatus according to an embodiment of the present invention.

FIG. 1 is a schematic diagram of the configuration of a writing apparatus according to the present embodiment. The writing apparatus includes a control unit 1 and a writing unit 2. The writing apparatus is an example of a multi charged particle beam writing apparatus. The writing unit 2 includes an electron optical column 20 and a writing chamber 30. The electron optical column 20 accommodates an electron gun 21, an illumination lens 22, an aperture member 23 (aperture plate), a blanking plate 24, a reduction lens 25, a limiting aperture member 26, an objective lens 27, and a deflector 28. Each of the reduction lens 25 and the objective lens 27 is an electromagnetic lens. The reduction lens 25 and the objective lens 27 constitute a reduction optical system.

The writing chamber 30 accommodates an XY stage 32. A substrate 40, serving as a writing target, is placed on the XY stage 32. Examples of the substrate 40 include an exposure mask used to fabricate a semiconductor device, a semiconductor substrate (silicon wafer) on which semiconductor devices are to be fabricated, and mask blanks that are coated with resist and that have not yet been subjected to writing.

The control unit 1 includes a storage unit 10, such as a magnetic disk unit, a bitmap generation unit 11, dose correction units 12 to 15, and a data transfer unit 16. The dose correction units 12 to 15 are arranged in parallel to one another between the bitmap generation unit 11 and the data transfer unit 16. The bitmap generation unit 11, the dose correction units 12 to 15, and the data transfer unit 16 are separate hardware components, such as computers including electric circuitry. A rasterizing computer may be used as the bitmap generation unit 11. A modulation computer may be used as the dose correction units 12 to 15. The modulation computer may include a transfer board, and a hardware that realizes functions of the dose correction units 12 to 15 is constructed on the transfer board. The bitmap generation unit 11 and the dose correction units 12 to 15 are connected by a bus. In addition, the dose correction units 12 to 15 and the data transfer unit 16 are connected by a bus. The dose correction units 12 to 15 may be implemented in software. When implemented in software, a program that realizes functions of the dose correction units 12 to 15 may be stored on a recording medium and read and executed by a computer including electric circuitry.

FIG. 1 illustrates the components necessary for description of the present embodiment. Other known components necessary for operation of the writing apparatus are not illustrated in FIG. 1.

The aperture member 23 has apertures (openings) arranged in a matrix of m columns extending in a longitudinal direction (y direction) of the member×n rows extending in a lateral direction (x direction) thereof (m, n≥2) at a predetermined pitch. For example, the aperture member 23 has 512×512 apertures. The apertures have the same dimensions and the same shape, such as a rectangular or circular shape.

The electron gun 21 emits an electron beam B. The illumination lens 22 causes the electron beam B to be applied substantially perpendicular to the entire aperture member 23. The electron beam B passes through the apertures of the aperture member 23, thus forming multiple electron beams (multiple beams) MB each having a rectangular shape in cross-section, for example.

The blanking plate 24 has passage holes aligned with the apertures of the aperture member 23. In each passage hole, two electrodes paired (a blanker: a blanking deflector) are arranged. One of the two electrodes for each beam is connected to an amplifier for applying voltage. The other of the two electrodes is grounded. Each of the electron beams passing through the passage holes can be independently deflected by voltage applied to the two paired electrodes. This electron beam deflection achieves blanking control.

The multiple beams MB passed through the blanking plate 24 are reduced by the reduction lens 25 and travel toward a central aperture of the limiting aperture member 26. The electron beams deflected by the blankers of the blanking plate 24 are deviated from the central aperture of the limiting aperture member 26 and are thus interrupted by the limiting aperture member 26. In contrast, the electron beams that have not been deflected by the blankers pass through the central aperture of the limiting aperture member 26.

As described above, the limiting aperture member 26 interrupts the beams deflected in a beam OFF state by such individual blanking mechanisms. The beams passed through the limiting aperture member 26 for a period between the time when the beams enter a beam ON state and the time when the beams are changed to the beam OFF state correspond to a one-time shot beam set.

The multiple beams MB passed through the limiting aperture member 26 are focused by the objective lens 27, thus forming a pattern image reduced at a desired reduction ratio. The beams are collectively deflected by the deflector 28 and are then applied to the substrate 40. For example, while the XY stage 32 is continuously moved, the deflector 28 controls the beams such that beam irradiation positions follow the movement of the XY stage 32.

The multiple beams MB applied at a time are ideally arranged at a pitch obtained by multiplying the arrangement pitch of the apertures of the aperture member 23 by the above-described desired reduction ratio. The writing apparatus performs a writing operation in a raster scanning manner such that shot beams are successively and sequentially applied. To write a desired pattern, the blanking control causes beams necessary for the pattern to enter the beam ON state.

Figure 2A:
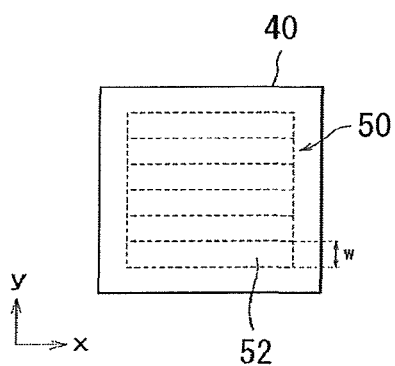
FIGS. 2A to 2E are diagrams explaining a manner of multi-pass writing.
Figure 2B:
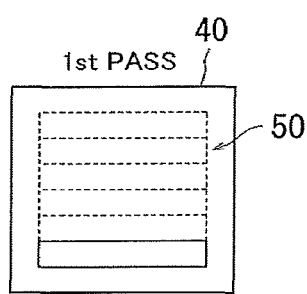
Figure 2C:
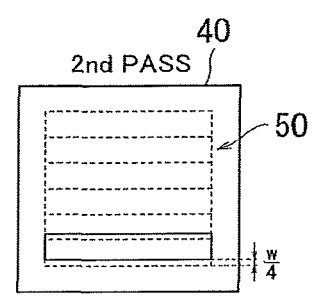
Figure 2D:
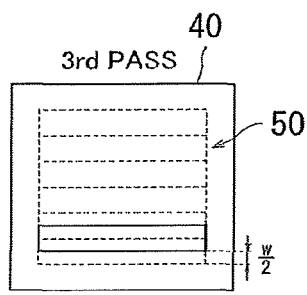
Figure 2E:
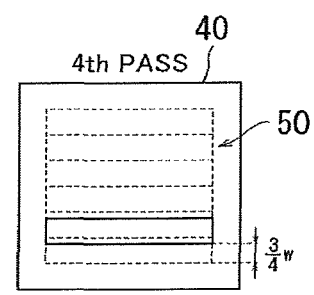

As illustrated in FIG. 2A, a writing area 50 of the substrate 40 is virtually divided into a plurality of stripe segments 52 that are strip-shaped parts having a predetermined width arranged in, for example, the y direction. Each stripe segment 52 serves as a writing unit region.

For example, the XY stage 32 is moved and adjusted such that an irradiation range, which can be irradiated with the multiple beams MB corresponding to one-time irradiation, is located at the left end of the first stripe segment 52 or at a position to the left of the left end thereof. Then, writing is started. The XY stage 32 is moved in the −x direction, thus performing writing relatively in the x direction.

The writing apparatus according to the present embodiment performs multi-pass writing. In multi-pass writing, a positional shift is produced in the y direction by an amount based on the stripe segment for each writing pass. For example, for four-pass writing (multiplicity=4) in which each positional shift corresponds to ¼ of the width, W, of the stripe segment, irradiation ranges for the writing passes are as illustrated in FIGS. 2B to 2E.

Specifically, in the first pass, writing is performed at a position with a stripe shift of 0 in the y direction. In the second pass, writing is performed at a position with a stripe shift of W/4 in the y direction. In the third pass, writing is performed at a position with a stripe shift of W/2 in the y direction. In the fourth pass, writing is performed at a position with a stripe shift of 3W/4 in the y direction.

The above-described multi-pass writing with positional shifts causes the same position on the substrate 40 to be irradiated with different beams in respective writing passes. Thus, variations in beam current can be averaged.

FIGS. 3A to 3D are diagrams explaining an example of the writing operation in the stripe segment 52. FIGS. 3A to 3D illustrate a case where writing is performed in the stripe segment 52 by using, for example, 4×4 multiple beams arranged in the x and y direction. This case corresponds to the first writing pass in FIG. 2B.

In the illustrated case, the beams are separated and the stripe segment 52 obtained by division has, for example, substantially the same width in the y direction as that of the irradiation range of the whole of the multiple beams. The irradiation positions are shifted on a mesh-by-mesh basis in the x direction or the y direction such that exposure (writing) for one irradiation range of the whole of the multiple beams is completed by using 16 shots.

Figure 3A:
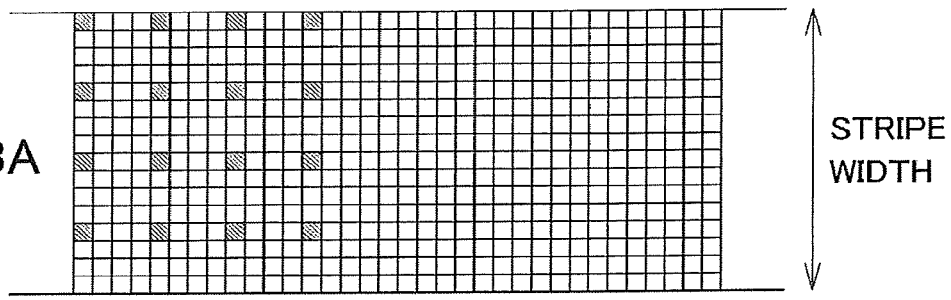
FIGS. 3A to 3D are diagrams explaining a writing operation in a stripe.
Figure 3B:
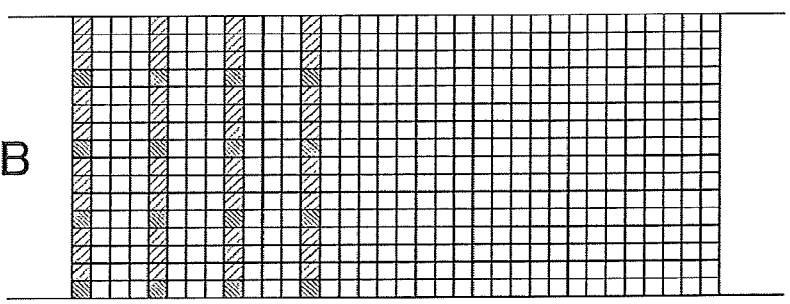
Figure 3C:
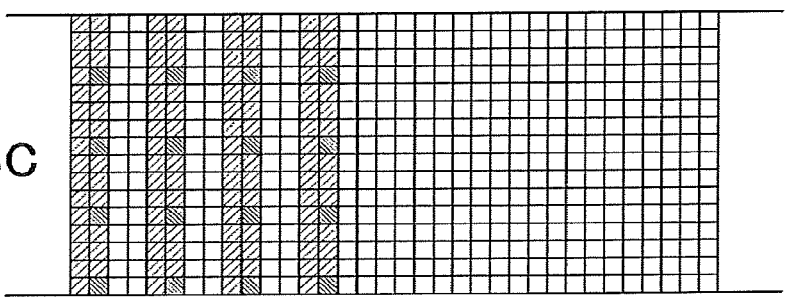
Figure 3D:
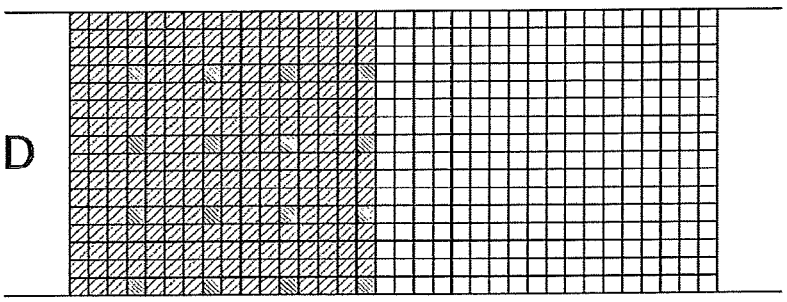

FIG. 3A illustrates mesh regions irradiated with one shot. Then, the second, third, and fourth shots are sequentially applied while the positions are shifted in the y direction on the mesh-by-mesh basis as illustrated in FIG. 3B. Then, as illustrated in FIG. 3C, the positions are shifted in the x direction by one mesh and the fifth shot is applied. Then, the sixth, seventh, and eighth shots are sequentially applied while the positions are shifted in the y direction on the mesh-by-mesh basis. The same operation is repeated to sequentially apply the remaining, or ninth to sixteenth shots as illustrated in FIG. 3D.

In multi-beam writing, the writing area 50 is virtually divided into meshes having a beam size or less. Beams are applied to meshes that correspond to a figure pattern and beams are not applied to meshes that do not correspond to the figure pattern, thus forming the pattern. If a mesh corresponds to, for example, the end of the figure pattern, the position of the end of the figure pattern is controlled by adjusting a dose.

In addition, doses have to be adjusted to correct a dimensional variation caused by, for example, a proximity effect. Calculation for proximity effect correction can be performed by using a traditional method. A dose is adjusted based on irradiation time of each of the multiple beams.

The storage unit 10 stores write data. The write data defines, for example, arrangement positions of figure patterns, the types of figures, and the dimensions of the figures. The write data further defines reference doses.

The bitmap generation unit 11 virtually divides the writing area 50 into the stripe segments 52 and then virtually divides each stripe segment 52 into the mesh regions. The bitmap generation unit 11 reads the write data from the storage unit 10 and allocates a figure pattern defined in the write data to the mesh regions. The bitmap generation unit 11 calculates the surface density of the figure pattern for each mesh region and further calculates the total irradiation time for each mesh position (beam irradiation position). In addition, the bitmap generation unit 11 equally divides the total irradiation time to passes of multi-pass writing for each mesh position (beam irradiation position). The bitmap generation unit 11 generates bitmap data, in which irradiation time periods are defined for respective mesh positions (beam irradiation positions), for each pass.

The bitmap generation unit 11 divides the bitmap data into bitmap subdata items and transfers the bitmap subdata items to the dose correction units 12 to 15. In this case, bitmap data for one stripe is divided into four bitmap subdata items, which are equal in number to the dose correction units 12 to 15. The bitmap subdata items are transferred to the dose correction units 12 to 15.

Figure 4A:
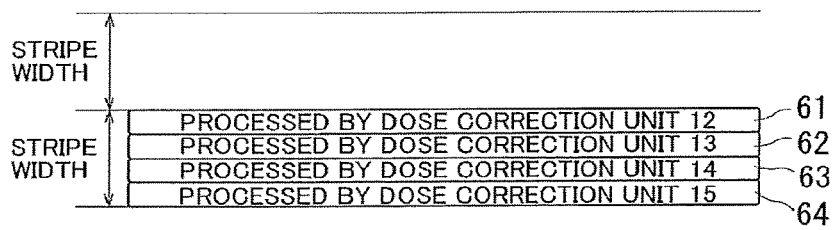
FIGS. 4A to 4D are diagrams explaining data processing ranges for dose correction units in multi-pass writing in the embodiment.

For example, as illustrated in FIG. 4A, bitmap data for the first writing pass is divided into four bitmap subdata items 61 to 64 in the y direction. The bitmap subdata item 61 is transferred to the dose correction unit 12. The bitmap subdata item 62 is transferred to the dose correction unit 13. The bitmap subdata item 63 is transferred to the dose correction unit 14. The bitmap subdata item 64 is transferred to the dose correction unit 15.

The dose correction units 12 to 15 each correct doses (irradiation time periods) for respective mesh positions (beam irradiation positions) in consideration of, for example, distortion of the blanking plate 24 and the sensitivity of a resist applied to the substrate 40.

Figure 5:
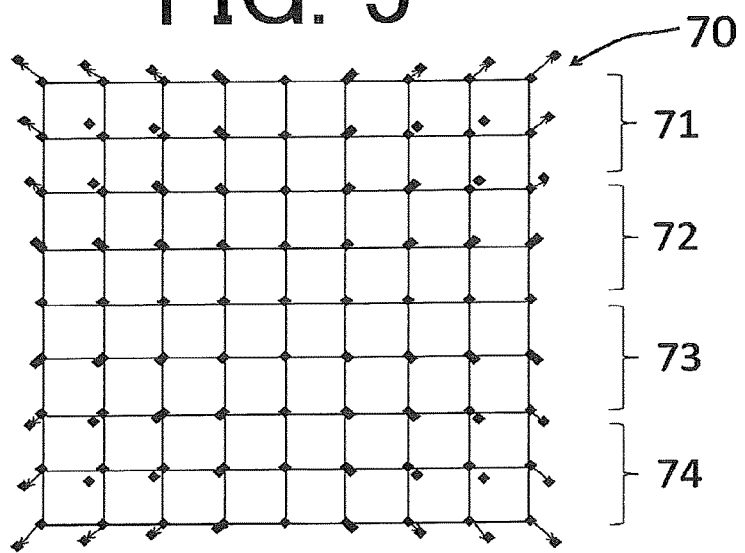
FIG. 5 is a diagram illustrating an exemplary distortion map.

Typically, in the writing apparatus, a beam array of the multiple beams MB applied to the substrate 40 may be deviated from an ideal grid due to, for example, position errors of the holes in the blanking plate 24 or optical errors. The dose correction units 12 to 15 each correct irradiation time periods for respective mesh positions (beam irradiation positions) with reference to a distortion map 70 that specifies the amounts of positional deviation of beams as illustrated in FIG. 5.

For example, in data processing for the first writing pass, the dose correction unit 12 corrects the irradiation time periods defined in the bitmap subdata item 61 with reference to a distortion submap 71, included in the distortion map 70, corresponding to the bitmap subdata item 61.

The dose correction unit 13 corrects the irradiation time periods defined in the bitmap subdata item 62 with reference to a distortion submap 72, included in the distortion map 70, corresponding to the position of the bitmap subdata item 62.

The dose correction unit 14 corrects the irradiation time periods defined in the bitmap subdata item 63 with reference to a distortion submap 73, included in the distortion map 70, corresponding to the position of the bitmap subdata item 63.

The dose correction unit 15 corrects the irradiation time periods defined in the bitmap subdata item 64 with reference to a distortion submap 74, included in the distortion map 70, corresponding to the position of the bitmap subdata item 64.

The irradiation time periods of the respective beams in the first writing pass can be corrected in the above-described manner.

Figure 4B:
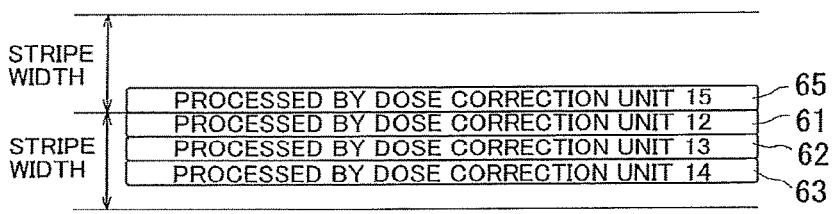

As illustrated in FIG. 4B, in data processing for the second writing pass, a bitmap subdata item 65 is transferred to the dose correction unit 15. The bitmap subdata item 65 is a bitmap subdata item corresponding to a region that has not been subjected to writing in the first writing pass and becomes a writing target in the second writing pass in response to a positional shift. The bitmap subdata items 61 to 63 are processed by the dose correction units 12 to 14, respectively. The dose correction units 12 to 14 have already received the bitmap subdata items 61 to 63 in the data processing for the preceding (first) writing pass.

In the data processing for the second writing pass, the dose correction unit 12 corrects the irradiation time periods defined in the bitmap subdata item 61 with reference to the distortion submap 72, included in the distortion map 70, corresponding to the bitmap subdata item 61.

The dose correction unit 13 corrects the irradiation time periods defined in the bitmap subdata item 62 with reference to the distortion submap 73, included in the distortion map 70, corresponding to the position of the bitmap subdata item 62.

The dose correction unit 14 corrects the irradiation time periods defined in the bitmap subdata item 63 with reference to the distortion submap 74, included in the distortion map 70, corresponding to the position of the bitmap subdata item 63.

The dose correction unit 15 corrects the irradiation time periods defined in the bitmap subdata item 65 with reference to the distortion submap 71, included in the distortion map 70, corresponding to the position of the bitmap subdata item 65.

The irradiation time periods of the respective beams in the second writing pass can be corrected in the above-described manner.

Figure 4C:
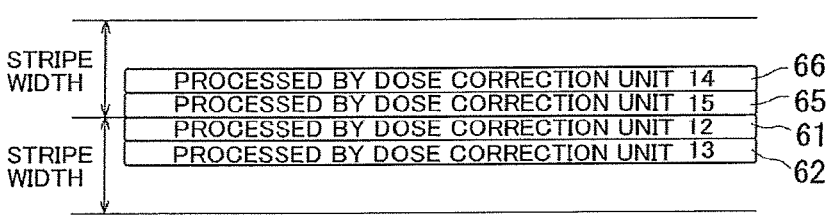

As illustrated in FIG. 4C, in data processing for the third writing pass, a bitmap subdata item 66 is transferred to the dose correction unit 14. The bitmap subdata items 61, 62, and 65 are processed by the dose correction units 12, 13, and 15, respectively. The dose correction units 12, 13, and 15 have already received the bitmap subdata items 61, 62, and 65 in the data processing for the previous (first or second) writing pass.

In the data processing for the third writing pass, the dose correction unit 12 corrects the irradiation time periods defined in the bitmap subdata item 61 with reference to the distortion submap 73, included in the distortion map 70, corresponding to the bitmap subdata item 61.

The dose correction unit 13 corrects the irradiation time periods defined in the bitmap subdata item 62 with reference to the distortion submap 74, included in the distortion map 70, corresponding to the position of the bitmap subdata item 62.

The dose correction unit 14 corrects the irradiation time periods defined in the bitmap subdata item 66 with reference to the distortion submap 71, included in the distortion map 70, corresponding to the position of the bitmap subdata item 66.

The dose correction unit 15 corrects the irradiation time periods defined in the bitmap subdata item 65 with reference to the distortion submap 72, included in the distortion map 70, corresponding to the position of the bitmap subdata item 65.

The irradiation time periods of the respective beams in the third writing pass can be corrected in the above-described manner.

Figure 4D:
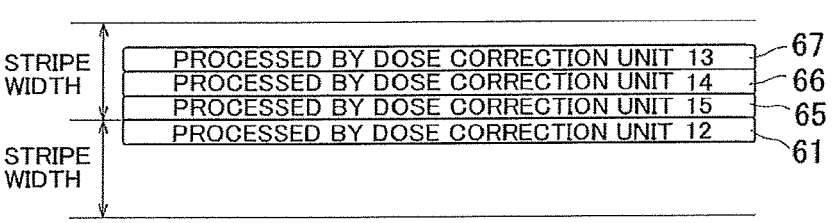

As illustrated in FIG. 4D, in data processing for the fourth writing pass, a bitmap subdata item 67 is transferred to the dose correction unit 13. The bitmap subdata items 61, 65, and 66 are processed by the dose correction units 12, 15, and 14, respectively. The dose correction units 12, 15, and 14 have already received the bitmap subdata items 61, 65, and 66 in the data processing for the previous (first, second, or third) writing pass.

In the data processing for the fourth writing pass, the dose correction unit 12 corrects the irradiation time periods defined in the bitmap subdata item 61 with reference to the distortion submap 74, included in the distortion map 70, corresponding to the bitmap subdata item 61.

The dose correction unit 13 corrects the irradiation time periods defined in the bitmap subdata item 67 with reference to the distortion submap 71, included in the distortion map 70, corresponding to the position of the bitmap subdata item 67.

The dose correction unit 14 corrects the irradiation time periods defined in the bitmap subdata item 66 with reference to the distortion submap 72, included in the distortion map 70, corresponding to the position of the bitmap subdata item 66.

The dose correction unit 15 corrects the irradiation time periods defined in the bitmap subdata item 65 with reference to the distortion submap 73, included in the distortion map 70, corresponding to the position of the bitmap subdata item 65.

The irradiation time periods of the respective beams in the fourth writing pass can be corrected in the above-described manner.

The dose correction unit 12 processes the bitmap subdata item 61 in the data processing for the first to fourth writing passes to correct the irradiation time periods defined in the bitmap subdata item 61 while changing a reference portion (the distortion submaps 71 to 74) of the distortion map 70.

While changing the reference portion of the distortion map 70, the dose correction unit 13 processes the bitmap subdata item 62 in the data processing for the first to third writing passes and processes the bitmap subdata item 67 in the data processing for the fourth writing pass.

While changing the reference portion of the distortion map 70, the dose correction unit 14 processes the bitmap subdata item 63 in the data processing for the first and second writing passes and processes the bitmap subdata item 66 in the data processing for the third and fourth writing passes.

While changing the reference portion of the distortion map 70, the dose correction unit 15 processes the bitmap subdata item 64 in the data processing for the first writing pass and processes the bitmap subdata item 65 in the data processing for the second to fourth writing passes.

As described above, the dose correction units 12 to 15 correct the irradiation time periods of the electron beams to pass through the passage holes in different portions of the blanking plate 24 in each writing pass. The data transfer unit 16 changes output destinations of irradiation time data items, generated through correction by the dose correction units 12 to 15, for each writing pass.

FIGS. 6A to 6D illustrate examples of changes of data output destinations through the data transfer unit 16.

Figure 6A:
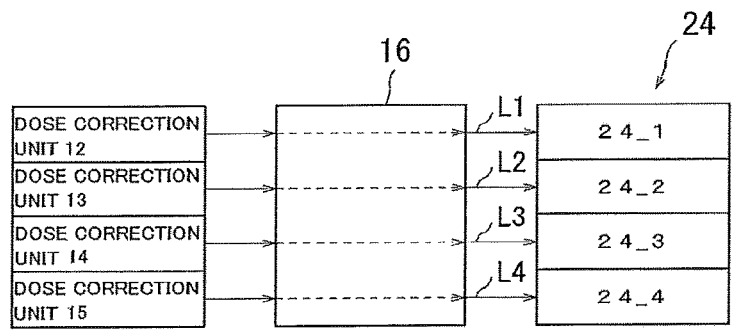
FIGS. 6A to 6D are diagrams explaining data transfer processing by a data transfer unit.

Referring to FIG. 6A, in the first writing pass, the data transfer unit 16 transfers dose data (irradiation time data) generated through dose correction by the dose correction unit 12 to the blanking plate 24 through a signal line L1. For example, this dose data specifies doses of beams to pass through the blankers located in a region 24_1, which is obtained by dividing the blanking plate 24 into four regions 24_1 to 24_4.

The data transfer unit 16 transfers dose data, generated through dose correction by the dose correction unit 13, associated with beams to pass through the blankers located in the region 24_2 to the blanking plate 24 through a signal line L2.

The data transfer unit 16 transfers dose data, generated through dose correction by the dose correction unit 14, associated with beams to pass through the blankers located in the region 24_3 to the blanking plate 24 through a signal line L3.

The data transfer unit 16 transfers dose data, generated through dose correction by the dose correction unit 15, associated with beams to pass through the blankers located in the region 24_4 to the blanking plate 24 through a signal line L4.

The signal lines L1 to L4 each include parallel signal lines (signal line group). For the convenience of description, each of the signal lines L1 to L4 is illustrated as a single signal line. The signal line (signal line group) L1 is used to transmit dose data for controlling the blankers located in the region 24_1. The signal line (signal line group) L2 is used to transmit dose data for controlling the blankers located in the region 24_2. The signal line (signal line group) L3 is used to transmit dose data for controlling the blankers located in the region 24_3. The signal line (signal line group) L4 is used to transmit dose data for controlling the blankers located in the region 24_4.

Figure 6B:
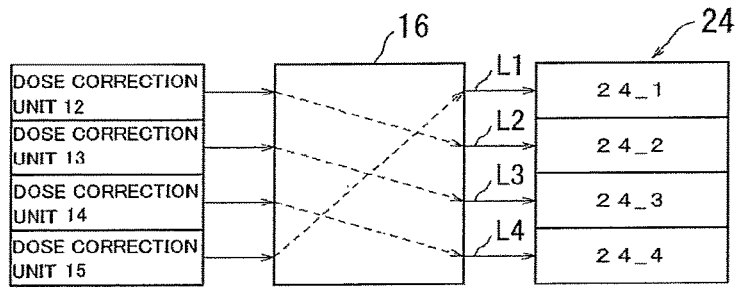

Referring to FIG. 6B, in the second writing pass, the data transfer unit 16 transfers dose data, generated through dose correction by the dose correction unit 12, associated with beams to pass through the blankers located in the region 24_2 to the blanking plate 24 through the signal line L2.

The data transfer unit 16 transfers dose data, generated through dose correction by the dose correction unit 13, associated with beams to pass through the blankers located in the region 24_3 to the blanking plate 24 through the signal line L3.

The data transfer unit 16 transfers dose data, generated through dose correction by the dose correction unit 14, associated with beams to pass through the blankers located in the region 24_4 to the blanking plate 24 through the signal line L4.

The data transfer unit 16 transfers dose data, generated through dose correction by the dose correction unit 15, associated with beams to pass through the blankers located in the region 24_1 to the blanking plate 24 through the signal line L1.

Figure 6C:
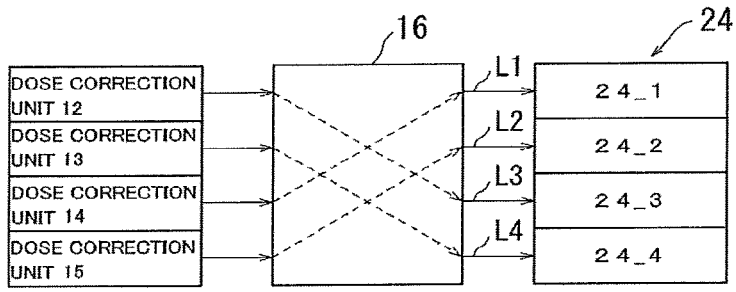

Referring to FIG. 6C, in the third writing pass, the data transfer unit 16 transfers dose data, generated through dose correction by the dose correction unit 12, associated with beams to pass through the blankers located in the region 24_3 to the blanking plate 24 through the signal line L3.

The data transfer unit 16 transfers dose data, generated through dose correction by the dose correction unit 13, associated with beams to pass through the blankers located in the region 24_4 to the blanking plate 24 through the signal line L4.

The data transfer unit 16 transfers dose data, generated through dose correction by the dose correction unit 14, associated with beams to pass through the blankers located in the region 24_1 to the blanking plate 24 through the signal line L1.

The data transfer unit 16 transfers dose data, generated through dose correction by the dose correction unit 15, associated with beams to pass through the blankers located in the region 24_2 to the blanking plate 24 through the signal line L2.

Figure 6D:
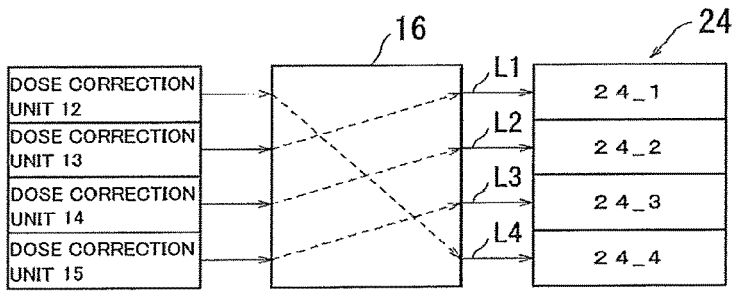

Referring to FIG. 6D, in the fourth writing pass, the data transfer unit 16 transfers dose data, generated through dose correction by the dose correction unit 12, associated with beams to pass through the blankers located in the region 24_4 to the blanking plate 24 through the signal line L4.

The data transfer unit 16 transfers dose data, generated through dose correction by the dose correction unit 13, associated with beams to pass through the blankers located in the region 24_1 to the blanking plate 24 through the signal line L1.

The data transfer unit 16 transfers dose data, generated through dose correction by the dose correction unit 14, associated with beams to pass through the blankers located in the region 24_2 to the blanking plate 24 through the signal line L2.

The data transfer unit 16 transfers dose data, generated through dose correction by the dose correction unit 15, associated with beams to pass through the blankers located in the region 24_3 to the blanking plate 24 through the signal line L3.

Each blanker of the blanking plate 24 performs, based on the transferred dose data, blanking control on the corresponding beam to control the irradiation time.

COMPARATIVE EXAMPLE

If the data transfer unit 16 for changing data output destinations is not provided, each of the dose correction units 12 to 15 would correct irradiation time periods of electron beams to pass through the passage holes in the same region of the blanking plate 24 for each writing pass. For example, the dose correction unit 12 corrects doses of beams to pass through the blankers located in the region 24_1 for each writing pass. Dose data, generated through dose correction by the dose correction unit 12, associated with the beams to pass through the blankers located in the region 24_1 is transferred to the blanking plate 24 through the signal line L1.

Similarly, dose data items, generated through dose correction by the dose correction units 13, 14, and 15, associated with beams to pass through the blankers located in the regions 24_2, 24_3, and 24_4 are transferred to the blanking plate 24 through the signal lines L2, L3, and L4, respectively.

Figure 7A:
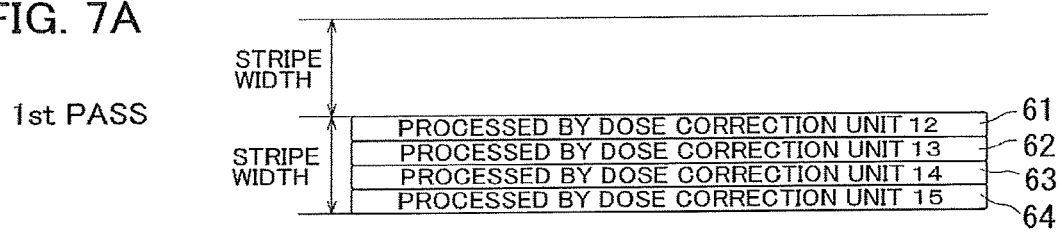
FIGS. 7A to 7D are diagrams explaining data processing ranges for correction units in multi-pass writing in Comparative Example.

For four-pass writing in which each positional shift corresponds to ¼ of the width W of the stripe segment, as illustrated in FIG. 7A, in data processing for the first writing pass, the dose correction units 12, 13, 14, and 15 correct irradiation time periods defined in the bitmap subdata items 61, 62, 63, and 64, respectively.

Figure 7B:
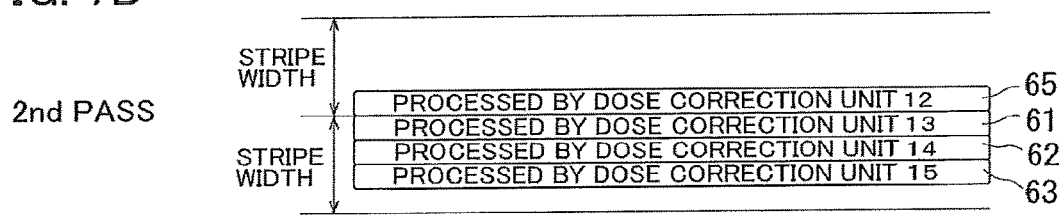

As illustrated in FIG. 7B, in data processing for the second writing pass, the dose correction units 12, 13, 14, and 15 correct irradiation time periods defined in the bitmap subdata items 65, 61, 62, and 63, respectively.

Figure 7C:
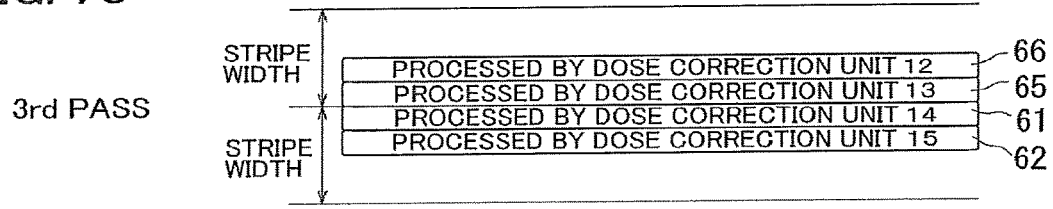

As illustrated in FIG. 7C, in data processing for the third writing pass, the dose correction units 12, 13, 14, and 15 correct irradiation time periods defined in the bitmap subdata items 66, 65, 61, and 62, respectively.

Figure 7D:
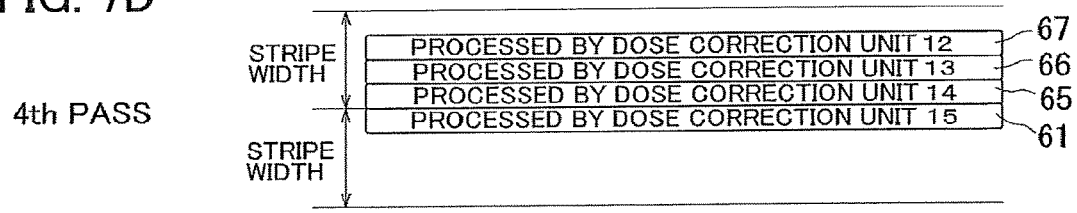

As illustrated in FIG. 7D, in data processing for the fourth writing pass, the dose correction units 12, 13, 14, and 15 correct irradiation time periods defined in the bitmap subdata items 67, 66, 65, and 61, respectively.

As described above, in the case where the data transfer unit 16 for changing data output destinations is not provided, the dose correction unit 12 processes the bitmap subdata items 61, 65, 66, and 67 in the data processing for the first to fourth writing passes. The dose correction unit 13 processes the bitmap subdata items 62, 61, 65, and 66 in the data processing for the first to fourth writing passes. The dose correction unit 14 processes the bitmap subdata items 63, 62, 61, and 65 in the data processing for the first to fourth writing passes. The dose correction unit 15 processes the bitmap subdata items 64, 63, 62, and 61 in the data processing for the first to fourth writing passes.

In other words, the dose correction units 12 to 15 each process four different bitmap subdata items. The bitmap generation unit 11 transfers four bitmap subdata items to each of the dose correction units 12 to 15. The amount of data transferred is large. Furthermore, the dose correction units 12 to 15 each require a large-capacity memory to hold four bitmap subdata items.

In contrast, according to the present embodiment, the data transfer unit 16 for changing data output destinations is provided. The dose correction unit 12 processes one bitmap subdata item (the bitmap subdata item 61) in the data processing for the first to fourth writing passes. The dose correction unit 13 processes two bitmap subdata items (the bitmap subdata items 62 and 67) in the data processing for the first to fourth writing passes. The dose correction unit 14 processes two bitmap subdata items (the bitmap subdata items 63 and 66) in the data processing for the first to fourth writing passes. The dose correction unit 15 processes two bitmap subdata items (the bitmap subdata items 64 and 65) in the data processing for the first to fourth writing passes.

The bitmap generation unit 11 transfers one or two bitmap subdata items to each of the dose correction units 12 to 15. In contrast to Comparative Example, the amount of data transferred can be reduced. The dose correction units 12 to 15 have only to hold one or two bitmap subdata items. This can reduce the memory capacity.

As described above, the data transfer unit 16 for changing data output destinations for the blanking plate 24 is provided, thus allowing for reduction in the number of bitmap subdata items to be processed by each of the dose correction units 12 to 15 for multi-pass writing with positional shifts in the y direction. Consequently, both the amount of data transferred and the memory capacity can be reduced.

Although four-pass writing (multiplicity=4) in which each positional shift corresponds to ¼ of the width W of the stripe segment has been described in the above-described embodiment, the amount of shift or the multiplicity are not limited to those in the above-described embodiment.

Figure 8A:
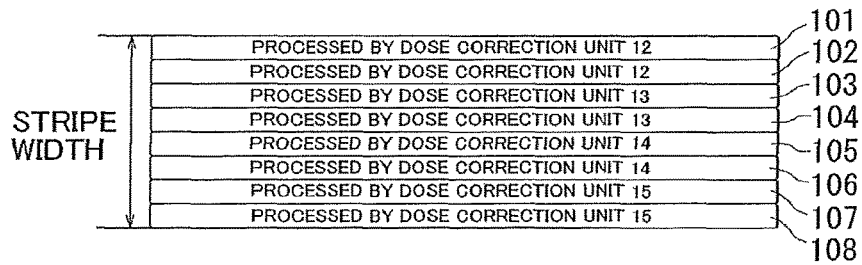
FIGS. 8A to 8D are diagrams explaining data processing ranges for the dose correction units in multi-pass writing in the embodiment.

FIGS. 8A to 8D, FIGS. 9E to 9H, FIGS. 10A to 10D, and FIGS. 11E to 11H illustrate an example of processing for eight-pass writing in which each positional shift corresponds to ⅛ of the width W of the stripe segment. For example, as illustrated in FIG. 8A, bitmap data about the first writing pass is divided into eight bitmap subdata items 101 to 108 in the y direction. The bitmap subdata items 101 and 102 are transferred to the dose correction unit 12. The bitmap subdata items 103 and 104 are transferred to the dose correction unit 13. The bitmap subdata items 105 and 106 are transferred to the dose correction unit 14. The bitmap subdata items 107 and 108 are transferred to the dose correction unit 15.

Figure 10A:
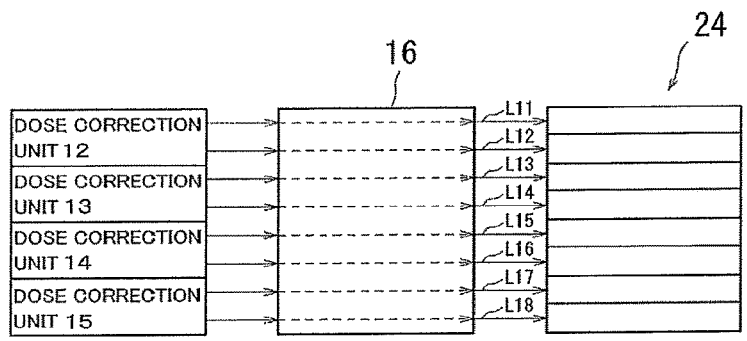
FIGS. 10A to 10D are diagrams explaining data transfer processing by the data transfer unit.

Referring to FIG. 10A, the data transfer unit 16 transfers dose data items, generated through dose correction by the dose correction unit 12, to the blanking plate 24 through signal lines L11 and L12. The data transfer unit 16 transfers dose data items, generated through dose correction by the dose correction unit 13, to the blanking plate 24 through signal lines L13 and L14. The data transfer unit 16 transfers dose data items, generated through dose correction by the dose correction unit 14, to the blanking plate 24 through signal lines L15 and L16. The data transfer unit 16 transfers dose data items, generated through dose correction by the dose correction unit 15, to the blanking plate 24 through signal lines L17 and L18.

Figure 8B:
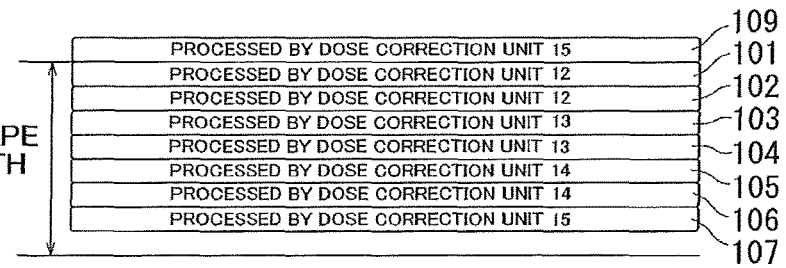

Referring to FIG. 8B, in data processing for the second writing pass, a bitmap subdata item 109 is transferred to the dose correction unit 15. The bitmap subdata items 101 and 102 are processed by the dose correction unit 12. The bitmap subdata items 103 and 104 are processed by the dose correction unit 13. The bitmap subdata items 105 and 106 are processed by the dose correction unit 14. The dose correction unit 15 processes the bitmap subdata items 107 and 109.

Figure 10B:
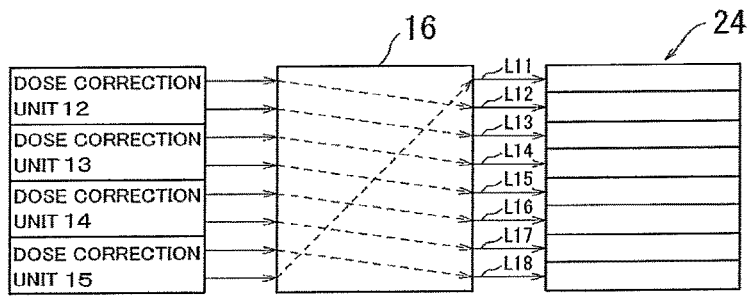

Referring to FIG. 10B, the data transfer unit 16 transfers dose data items, generated through dose correction by the dose correction unit 12, to the blanking plate 24 through the signal lines L12 and L13. The data transfer unit 16 transfers dose data items, generated through dose correction by the dose correction unit 13, to the blanking plate 24 through the signal lines L14 and L15. The data transfer unit 16 transfers dose data items, generated through dose correction by the dose correction unit 14, to the blanking plate 24 through the signal lines L16 and L17. The data transfer unit 16 transfers dose data items, generated through dose correction by the dose correction unit 15, to the blanking plate 24 through the signal lines L11 and L18.

Figure 8C:
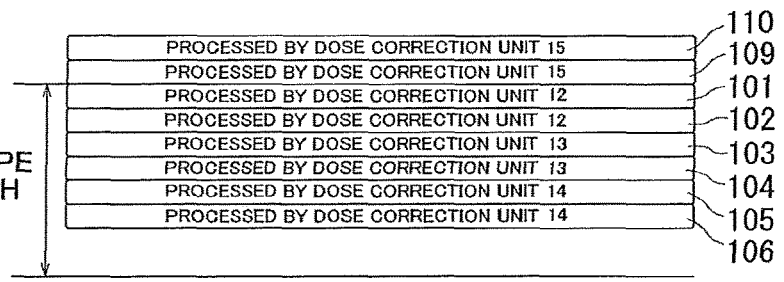

Referring to FIG. 8C, in data processing for the third writing pass, a bitmap subdata item 110 is transferred to the dose correction unit 15. The bitmap subdata items 101 and 102 are processed by the dose correction unit 12. The bitmap subdata items 103 and 104 are processed by the dose correction unit 13. The bitmap subdata items 105 and 106 are processed by the dose correction unit 14. The dose correction unit 15 processes the bitmap subdata items 109 and 110.

Figure 10C:
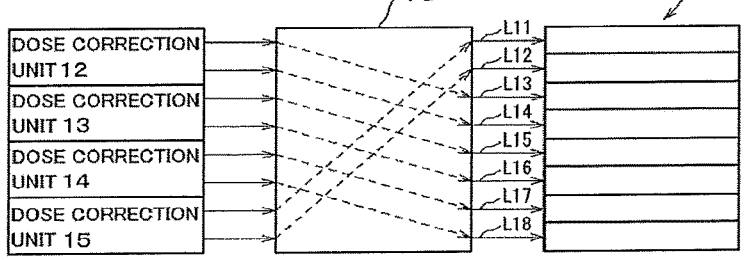

Referring to FIG. 10C, the data transfer unit 16 transfers dose data items, generated through dose correction by the dose correction unit 12, to the blanking plate 24 through the signal lines L13 and L14. The data transfer unit 16 transfers dose data items, generated through dose correction by the dose correction unit 13, to the blanking plate 24 through the signal lines L15 and L16. The data transfer unit 16 transfers dose data items, generated through dose correction by the dose correction unit 14, to the blanking plate 24 through the signal lines L17 and L18. The data transfer unit 16 transfers dose data items, generated through dose correction by the dose correction unit 15, to the blanking plate 24 through the signal lines L11 and L12.

Figure 8D:
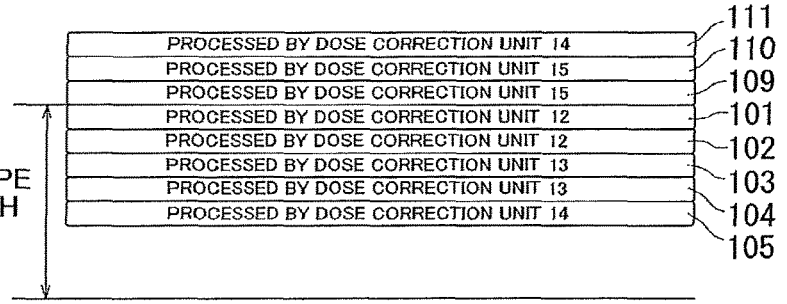

Referring to FIG. 8D, in data processing for the fourth writing pass, a bitmap subdata item 111 is transferred to the dose correction unit 14. The bitmap subdata items 101 and 102 are processed by the dose correction unit 12. The bitmap subdata items 103 and 104 are processed by the dose correction unit 13. The bitmap subdata items 109 and 110 are processed by the dose correction unit 15. The dose correction unit 14 processes the bitmap subdata items 105 and 111.

Figure 10D:
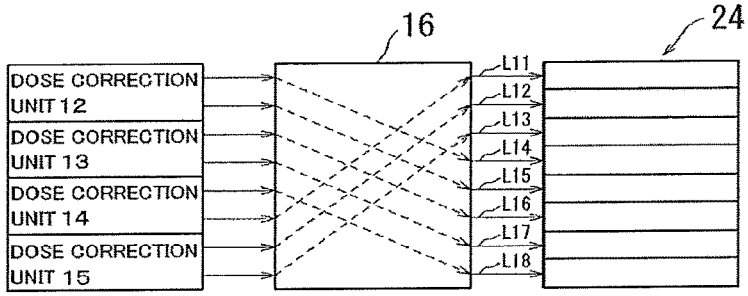

Referring to FIG. 10D, the data transfer unit 16 transfers dose data items, generated through dose correction by the dose correction unit 12, to the blanking plate 24 through the signal lines L14 and L15. The data transfer unit 16 transfers dose data items, generated through dose correction by the dose correction unit 13, to the blanking plate 24 through the signal lines L16 and L17. The data transfer unit 16 transfers dose data items, generated through dose correction by the dose correction unit 14, to the blanking plate 24 through the signal lines L11 and L18. The data transfer unit 16 transfers dose data items, generated through dose correction by the dose correction unit 15, to the blanking plate 24 through the signal lines L12 and L13.

Figure 9E:
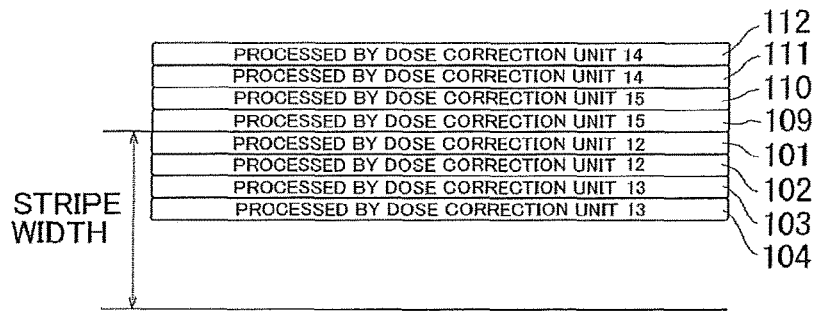
FIGS. 9E to 9H are diagrams explaining data processing ranges for the dose correction units in multi-pass writing in the embodiment.

Referring to FIG. 9E, in data processing for the fifth writing pass, a bitmap subdata item 112 is transferred to the dose correction unit 14. The bitmap subdata items 101 and 102 are processed by the dose correction unit 12. The bitmap subdata items 103 and 104 are processed by the dose correction unit 13. The bitmap subdata items 109 and 110 are processed by the dose correction unit 15. The dose correction unit 14 processes the bitmap subdata items 111 and 112.

Referring to FIG. 11E, the data transfer unit 16 transfers dose data items, generated through dose correction by the dose correction unit 12, to the blanking plate 24 through the signal lines L15 and L16. The data transfer unit 16 transfers dose data items, generated through dose correction by the dose correction unit 13, to the blanking plate 24 through the signal lines L17 and L18. The data transfer unit 16 transfers dose data items, generated through dose correction by the dose correction unit 14, to the blanking plate 24 through the signal lines L11 and L12. The data transfer unit 16 transfers dose data items, generated through dose correction by the dose correction unit 15, to the blanking plate 24 through the signal lines L13 and L14.

Figure 9F:
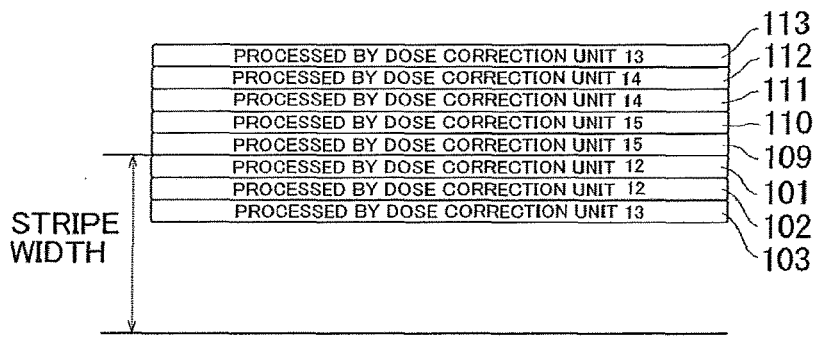

Referring to FIG. 9F, in data processing for the sixth writing pass, a bitmap subdata item 113 is transferred to the dose correction unit 13. The bitmap subdata items 101 and 102 are processed by the dose correction unit 12. The bitmap subdata items 109 and 110 are processed by the dose correction unit 15. The bitmap subdata items 111 and 112 are processed by the dose correction unit 14. The dose correction unit 13 processes the bitmap subdata items 103 and 113.

Referring to FIG. 11F, the data transfer unit 16 transfers dose data items, generated through dose correction by the dose correction unit 12, to the blanking plate 24 through the signal lines L16 and L17. The data transfer unit 16 transfers dose data items, generated through dose correction by the dose correction unit 13, to the blanking plate 24 through the signal lines L11 and L18. The data transfer unit 16 transfers dose data items, generated through dose correction by the dose correction unit 14, to the blanking plate 24 through the signal lines L12 and L13. The data transfer unit 16 transfers dose data items, generated through dose correction by the dose correction unit 15, to the blanking plate 24 through the signal lines L14 and L15.

Figure 9G:
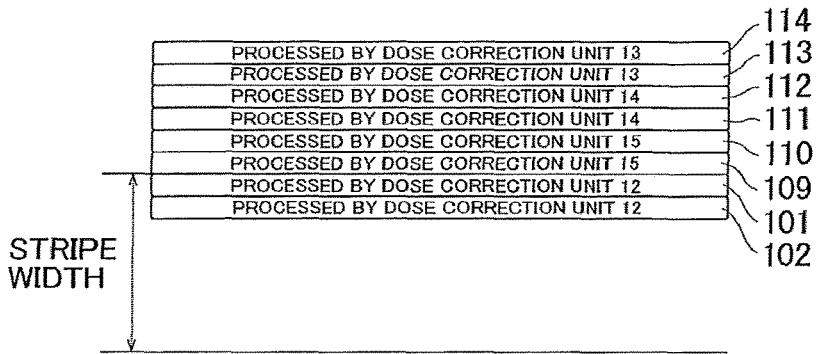

Referring to FIG. 9G, in data processing for the seventh writing pass, a bitmap subdata item 114 is transferred to the dose correction unit 13. The bitmap subdata items 101 and 102 are processed by the dose correction unit 12. The bitmap subdata items 109 and 110 are processed by the dose correction unit 15. The bitmap subdata items 111 and 112 are processed by the dose correction unit 14. The dose correction unit 13 processes the bitmap subdata items 113 and 114.

Referring to FIG. 11G, the data transfer unit 16 transfers dose data items, generated through dose correction by the dose correction unit 12, to the blanking plate 24 through the signal lines L17 and L18. The data transfer unit 16 transfers dose data items, generated through dose correction by the dose correction unit 13, to the blanking plate 24 through the signal lines L11 and L12. The data transfer unit 16 transfers dose data items, generated through dose correction by the dose correction unit 14, to the blanking plate 24 through the signal lines L13 and L14. The data transfer unit 16 transfers dose data items, generated through dose correction by the dose correction unit 15, to the blanking plate 24 through the signal lines L15 and L16.

Figure 9H:
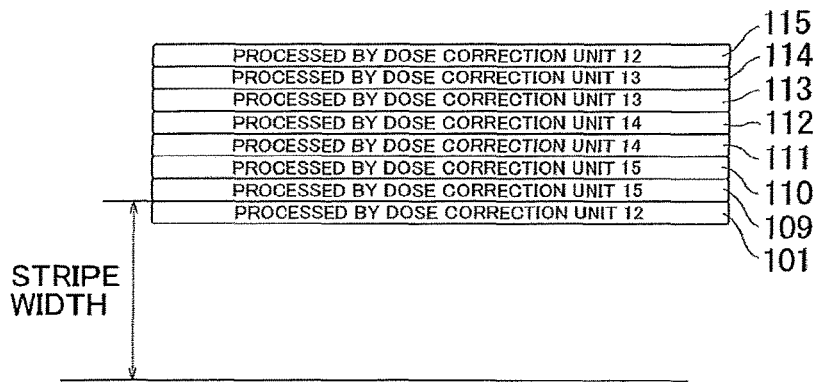

Referring to FIG. 9H, in data processing for the eighth writing pass, a bitmap subdata item 115 is transferred to the dose correction unit 12. The dose correction unit 12 processes the bitmap subdata items 101 and 115. The bitmap subdata items 109 and 110 are processed by the dose correction unit 15. The bitmap subdata items 111 and 112 are processed by the dose correction unit 14. The bitmap subdata items 113 and 114 are processed by the dose correction unit 13.

Referring to FIG. 11H, the data transfer unit 16 transfers dose data items, generated through dose correction by the dose correction unit 12, to the blanking plate 24 through the signal lines L11 and L18. The data transfer unit 16 transfers dose data items, generated through dose correction by the dose correction unit 13, to the blanking plate 24 through the signal lines L12 and L13. The data transfer unit 16 transfers dose data items, generated through dose correction by the dose correction unit 14, to the blanking plate 24 through the signal lines L14 and L15. The data transfer unit 16 transfers dose data items, generated through dose correction by the dose correction unit 15, to the blanking plate 24 through the signal lines L16 and L17.

The dose correction unit 12 processes the three bitmap subdata items (bitmap subdata items 101, 102, and 115) in the data processing for the first to eighth writing passes. The dose correction unit 13 processes the four bitmap subdata items (bitmap subdata items 103, 104, 113, and 114) in the data processing for the first to eighth writing passes. The dose correction unit 14 processes the four bitmap subdata items (bitmap subdata items 105, 106, 111, and 112) in the data processing for the first to eighth writing passes. The dose correction unit 15 processes the four bitmap subdata items (bitmap subdata items 107 to 110) in the data processing for the first to eighth writing passes.

Since the data transfer unit 16 changes data output destinations, the dose correction units 12 to 15 each have only to process part of bitmap data. Thus, the amount of data transferred from the bitmap generation unit 11 to the dose correction units 12 to 15 can be lowered. In addition, the capacity of the memory included in each of the dose correction units 12 to 15 can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   a movable stage on which a substrate, serving as a writing target, is placed;
   an emitter emitting a charged particle beam;
   an aperture plate including a plurality of openings through which the charged particle beam passes to form multiple beams;
   a blanking plate including a plurality of blankers each performing blanking deflection on a corresponding one of the multiple beams;
   bitmap generation processing circuitry generating bitmap data for each writing pass of multi-pass writing, the bitmap data specifying irradiation time periods for a plurality of irradiation positions allocated to meshes obtained by virtually dividing a writing area of the substrate;
   a plurality of dose correction units configured to receive bitmap subdata items obtained by dividing the bitmap data from the bitmap generation processing circuitry, correct the irradiation time periods to generate a plurality of dose data items corresponding to respective processing ranges, and hold the plurality of dose data items;
   a plurality of signal line groups, each signal line group formed of a plurality of signal lines, wherein each respective signal line group transmits a corresponding data item to a corresponding region of the blanking plate; and
   data transfer processing circuitry transferring the plurality of dose data items generated or held by the plurality of dose correction units to the blanking plate through the plurality of signal line groups,
   wherein the data transfer processing circuitry changes the correspondence of the plurality of dose data items generated or held by the respective dose correction units to the respective signal line groups to thereby change which respective of the signal line groups receives a respective dose data item, for each writing pass,
   the multi-pass writing is performed while a writing range is shifted for each writing pass,
   each of the dose correction units corrects the irradiation time periods with reference to a distortion map for the blanking plate, and changes a reference portion of the distortion map for each writing pass, a part of a writing range of an nth (n is an integer of 2 or more) writing pass is overlapped with a writing range of an (n−1)th writing pass, the plurality of dose correction units include a first dose correction unit and a second dose correction unit, the bitmap generation processing circuitry transmits a bitmap subdata item corresponding to a region that has not been subjected to writing in the (n−1)th writing pass and becomes a writing target in the nth writing pass to the first dose correction unit, and the second dose correction unit stores the bitmap subdata item corresponding to an overlapped writing range between the (n−1)th writing pass and the nth writing pass, and corrects the irradiation time periods specified in the stored same bitmap subdata item for the (n−1)th and nth passes.

2. A multi charged particle beam writing method for performing multi-pass writing with multiple beams including charged particle beams, the method comprising:

generating bitmap data for each writing pass of multi-pass writing, the bitmap data specifying irradiation time periods for a plurality of irradiation positions allocated to meshes obtained by virtually dividing a writing area of a substrate;

causing a plurality of dose correction units to receive bitmap subdata items obtained by dividing the bitmap data, correct the irradiation time periods to generate a plurality of dose data items corresponding to respective processing ranges, and hold the plurality of dose data items;

transferring the plurality of dose data items generated and held by the plurality of dose correction units to a blanking plate through a plurality of signal line groups, each signal group formed of a plurality of signal lines, wherein each respective signal line group transmits a corresponding data item to a corresponding region of the blanking plate, the blanking plate including a plurality of blankers corresponding one-to-one to the multiple beams; and causing the plurality of blankers to perform blanking deflection on the corresponding beams in accordance with the plurality of dose data items, wherein each of the signal line groups is used to transmit the dose data item for controlling the blankers located in a corresponding region of the blanking plate, the signal line groups, used to transfer the plurality of dose data items generated or held by the respective dose correction units, are used to change the correspondence of the plurality of dose data items generated or held by the respective dose correction units to the respective signal line groups to thereby change which respective of the signal line groups receives a respective dose data item, for each writing pass, the multi-pass writing is performed while a writing range is shifted for each writing pass, each of the dose correction units corrects the irradiation time periods with reference to a distortion map for the blanking plate, and changes a reference portion of the distortion map for each writing pass, a part of a writing range of an nth (n is an integer of 2 or more) writing pass is overlapped with a writing range of an (n−1)th writing pass, the plurality of dose correction units include a first dose correction unit and a second dose correction unit, a bitmap subdata item corresponding to a region that has not been subjected to writing in the (n−1)th writing pass and becomes a writing target in the nth writing pass is transmitted to the first dose correction unit, and the second dose correction unit stores the bitmap subdata item corresponding to an overlapped writing range between the (n−1)th writing pass and the nth writing pass, and corrects the irradiation time periods specified in the stored same bitmap subdata item for the (n−1)th and nth passes.

* * * * *